(12) United States Patent
Okada et al.

(10) Patent No.: US 10,011,056 B2
(45) Date of Patent: Jul. 3, 2018

(54) IMPRINT APPARATUS AND ARTICLE MANUFACTURING METHOD

(71) Applicant: CANON KABUSHIKI KAISHA, Tokyo (JP)

(72) Inventors: Tetsuji Okada, Utsunomiya (JP);
Noriyasu Hasegawa, Utsunomiya (JP);
Tosiya Asano, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 306 days.

(21) Appl. No.: 14/796,009

(22) Filed: Jul. 10, 2015

(65) Prior Publication Data
US 2016/0009021 A1    Jan. 14, 2016

(30) Foreign Application Priority Data
Jul. 11, 2014    (JP) ................. 2014-143653

(51) Int. Cl.
B29C 59/00    (2006.01)
B29C 43/02    (2006.01)
G03F 9/00    (2006.01)
G03F 7/00    (2006.01)
B29C 43/58    (2006.01)

(52) U.S. Cl.
CPC ............ B29C 43/58 (2013.01); B29C 43/021 (2013.01); G03F 7/0002 (2013.01); G03F 9/7042 (2013.01); B29C 2043/025 (2013.01); B29C 2043/5833 (2013.01)

(58) Field of Classification Search
CPC ............... B29C 43/58; B29C 43/021; B29C 2043/5833; B29C 40/358; B29C 2043/5808; G03F 9/7042; G03F 7/0002; B82Y 10/00

USPC .......... 264/40.1, 40, 100, 40.5; 425/149, 385
See application file for complete search history.

(56) References Cited

U.S. PATENT DOCUMENTS 7,828,984 B2    11/2010    Seki et al.
2013/0182236 A1*    7/2013    De Schiffart .......... B29C 43/021
                                                                        355/74

FOREIGN PATENT DOCUMENTS

JP    2007137051 A    6/2007
JP    2010080714 A    4/2010
JP    2013538447 A    10/2013
(Continued)

OTHER PUBLICATIONS

Office Action issued in Korean Application No. 10-2015-0095139 dated Jan. 5, 2018.

*Primary Examiner* — John Goff
*Assistant Examiner* — Christian Roldan
(74) *Attorney, Agent, or Firm* — Rossi, Kimms & McDowell LLP

(57) ABSTRACT

The present invention provides an imprint apparatus including an amplifier configured to amplify a signal of displacement between a mold and a substrate, and a control unit configured to perform alignment between the mold and the substrate based on the amplified signal, wherein the control unit performs the alignment through a first operation of moving the substrate with respect to the mold in a first direction and a second operation of moving the substrate with respect to the mold in a second direction that is opposite to the first direction, and in the first operation, the control unit sets the gain of the amplifier to a first gain and changes the gain of the amplifier from the first gain to a second gain.

8 Claims, 3 Drawing Sheets

(56) References Cited

FOREIGN PATENT DOCUMENTS

| KR | 1020130008463 A | 1/2013 |
|---|---|---|
| WO | 2012016744 A1 | 2/2012 |

* cited by examiner

F I G. 4A
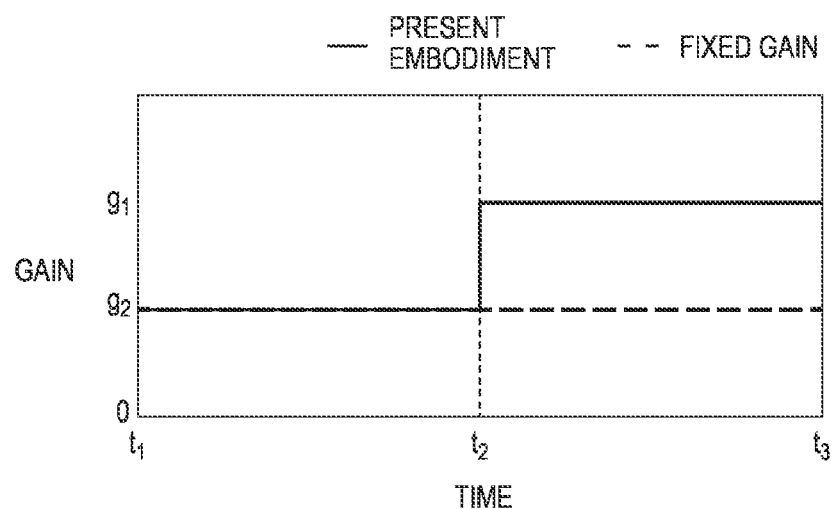
F I G. 4B
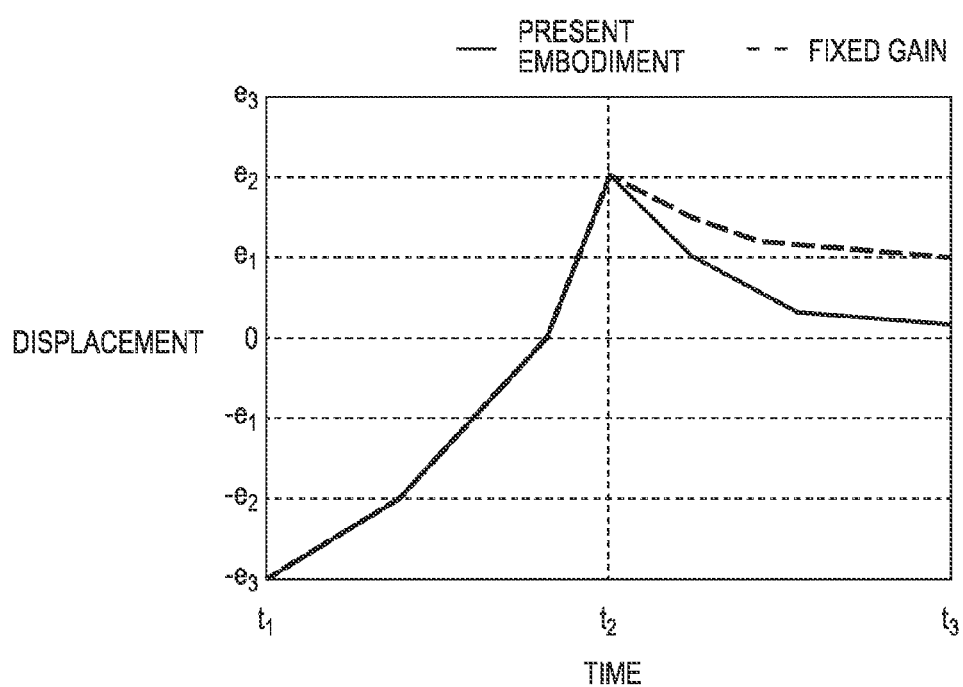

IMPRINT APPARATUS AND ARTICLE MANUFACTURING METHOD

BACKGROUND OF THE INVENTION

Field of the Invention

The present invention relates to an imprint apparatus and an article manufacturing method.

Description of the Related Art

There has been increasing demand for miniaturizing semiconductor devices, MEMSs, and the like, and attention is now paid to conventional photolithography techniques as well as miniaturizing process techniques by which uncured resin on a substrate is molded using a mold to form a resin pattern on the substrate. These techniques are called imprint techniques, by which a several nanometer-order fine structure (pattern) can be formed on a substrate. For example, a photo-curing method is one of the imprint techniques.

In an imprint apparatus that employs the photo-curing method, initially, photo-curing resin (ultraviolet-curing resin) is supplied (coated) to a shot region (imprint region) of a substrate, and this resin (uncured resin) is molded using a mold. Then, light (ultraviolet) is irradiated to cure the resin, the mold is separated (released) from the cured resin on the substrate, and a resin pattern is thereby formed on the substrate.

The substrate to be subjected to imprint process undergoes heating process in a deposition process such as spattering, for example, during the process of manufacturing a device, and accordingly the entire substrate expands or shrinks, and the shape (size) thereof changes in directions of two orthogonal axes in a plane in some cases. Accordingly, in the imprint apparatus, it is necessary, when bringing the resin on the substrate into contact with the mold, to match the shape of a pattern formed on the substrate (substrate pattern) and the shape of a pattern formed on the mold (mold pattern) with each other. The imprint apparatus includes a shape correction mechanism (magnification correction mechanism) that deforms the mold pattern and the substrate pattern by applying external force from a side face of the mold or applying heat to the mold and the substrate, for example.

Now consider the case of applying the imprint apparatus to a manufacturing process of a semiconductor device with about 32 nm half-pitch, for example. In this case, the overlay accuracy is 6.4 nm according to ITRS (International Technology Roadmap for Semiconductors). Accordingly, in order to conform thereto, shape correction also needs to be carried out at an accuracy of several nm or less.

A technique for matching the shape of the substrate pattern and the shape of the mold pattern with each other to improve overlay accuracy is proposed in Japanese Patent Laid-Open No. 2010-080714. With the technique disclosed in Japanese Patent Laid-Open No. 2010-080714, the mold is deformed by a mold chuck that holds the mold to match the substrate pattern and the mold pattern with each other. A technique for performing alignment between the mold and the substrate is also proposed in Japanese Patent Laid-Open No. 2007-137051. With the technique disclosed in Japanese Patent Laid-Open No. 2007-137051, when performing the alignment between the mold and the substrate in a state where the mold is in contact with resin on the substrate, pressure force of the mold against the resin is lowered, thereby facilitating adjustment of a positional relationship between the mold and the substrate.

In the imprint apparatus, as the miniaturization of patterns formed on the substrate advances, the thickness of resin (residual layer) at the time of the imprint process needs to be thinned for an etching process, which is a post-process. Accordingly, when molding the resin, the resin having a thickness of several dozen nm or less is sandwiched between the mold and the substrate. It is known that a liquid held in a small gap with such an order is structured and obtains a large viscoelasticity property.

When the mold and the substrate are relatively moved for alignment in a state where the mold is in contact with the resin on the substrate (i.e., in a state where the resin is sandwiched between the mold and the substrate), force is applied to the mold and the substrate in a direction (shearing direction) parallel with a contact surface, due to the viscoelasticity of the resin. Also, if a foreign particle is sandwiched between the mold and the substrate, the mold and the substrate mesh with each other due to this foreign particle, and force in a direction parallel with the contact surface is applied to the mold and the substrate as in the aforementioned case.

This force in the direction parallel with the contact surface acts as disturbance force during the alignment between the mold and the substrate, and therefore degrades controllability in the alignment between the mold and the substrate. In other words, if force in the direction parallel with the contact surface is generated on the mold and the substrate during the alignment between the mold and the substrate, the accuracy of the alignment between the mold and the substrate lowers, and the time taken for the alignment between the mold and the substrate becomes longer.

SUMMARY OF THE INVENTION

The present invention provides an imprint apparatus that is advantageous in the alignment between a mold and a substrate.

According to one aspect of the present invention, there is provided an imprint apparatus that forms a pattern of an imprint material on a substrate using a mold, the apparatus including a detection unit configured to output a signal of displacement between the mold and the substrate by detecting positions of the mold and the substrate in a direction parallel with a surface of the substrate, an amplifier configured to amplify the signal, and a control unit configured to perform alignment between the mold and the substrate based on the signal that has been amplified by the amplifier, wherein force in one direction applied to at least one of the mold and the substrate in a case of relatively and continuously moving the mold and the substrate in the direction in a state where the mold is in contact with the imprint material increases at a first increasing rate in a first region in which the amount of movement of the substrate from an initial point, which is a position of the substrate when starting the movement, with respect to the mold does not exceed a threshold, and increases at a second increasing rate that is smaller than the first increasing rate in a second region in which the amount of movement exceeds the threshold, the control unit performs the alignment through a first operation of moving the substrate with respect to the mold in a first direction such that the amount of movement exceeds the threshold, and a second operation of moving the substrate with respect to the mold in a second direction that is opposite to the first direction by an amount of movement that does not exceed the threshold, and in the first operation, the control unit sets the gain of the amplifier to a first gain in the first region, and sets the gain of the amplifier to a second gain that is smaller than the first gain in at least a part of the second region.

Further aspects of the present invention will become apparent from the following description of exemplary embodiments with reference to the attached drawings.

BRIEF DESCRIPTION OF THE DRAWINGS

FIGS. 4A and 4B are diagrams showing an example of a gain that is set for an amplifier and displacement between the mold and the substrate.

DESCRIPTION OF THE EMBODIMENTS

Figure 1:
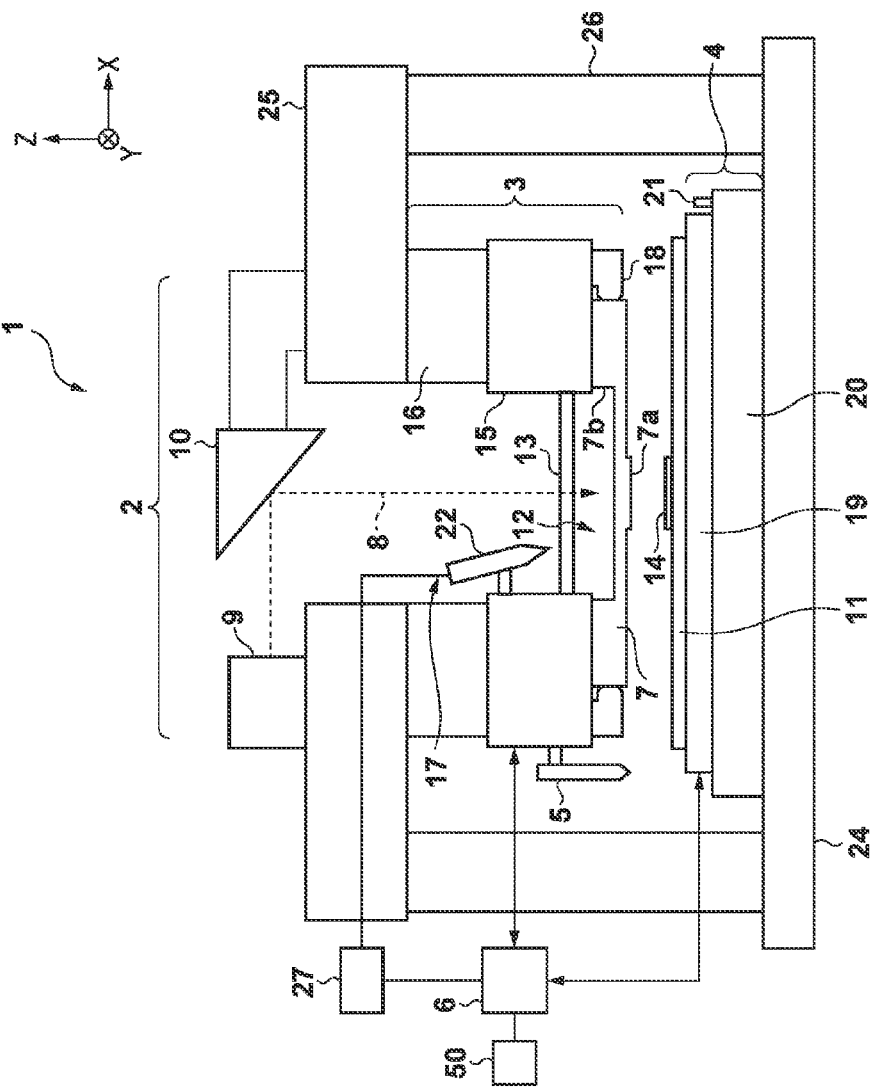
FIG. 1 is a schematic diagram showing a configuration of an imprint apparatus as an aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic diagram showing a configuration of an imprint apparatus 1 as an aspect of the present invention. The imprint apparatus 1 is a lithography apparatus used to manufacture devices such as a semiconductor device as an article. The imprint apparatus 1 performs imprint process for molding an imprint material (uncured resin) on a substrate using a mold to form a pattern on the substrate. In the present embodiment, the imprint apparatus 1 employs a photo-curing method. In the following description, a direction parallel with a direction in which ultraviolet is irradiated to the resin on the substrate is a Z-axis, and two orthogonal directions in a plane perpendicular to the Z-axis are an X-axis and a Y-axis.

As shown in FIG. 1, the imprint apparatus 1 includes an irradiation unit 2, a mold holding unit 3, a substrate stage 4, a resin supply unit 5 (dispenser), a control unit 6, a shape correction unit 18, an alignment detection unit 22, an amplifier 27, and a detection unit 50. The imprint apparatus 1 also includes a base surface plate 24 on which the substrate stage 4 is placed, a bridge surface plate 25 that fixes the mold holding unit 3, and a column 26 that is provided on the base surface plate 24 and is for supporting the bridge surface plate 25. Furthermore, the imprint apparatus 1 includes a mold conveyance mechanism that conveys a mold 7 from the outside of the apparatus to the imprint apparatus 1 (the mold holding unit 3), and a substrate conveyance mechanism that conveys a substrate 11 from the outside of the apparatus to the imprint apparatus 1 (the substrate stage 4).

In the imprint process, the irradiation unit 2 irradiates ultraviolet (i.e., light for curing resin 14) 8 to the resin 14 on the substrate 11 via the mold 7. The irradiation unit 2 includes a light source 9, and an optical element 10 for adjusting the ultraviolet 8 from the light source 9 to light appropriate for the imprint process. Since the photo-curing method is employed in the present embodiment, the imprint apparatus 1 includes the irradiation unit 2. However, in the case of employing a heat-curing method, the imprint apparatus 1 will include a heat source for curing resin (thermo-setting resin) in place of the irradiation unit 2.

The mold 7 has a rectangular outer shape, and includes a three-dimensionally formed pattern (a recess-and-projection pattern such as a circuit pattern that is to be transferred onto the substrate 11) 7a on a surface (pattern surface) facing the substrate 11. The mold 7 is made of a material through which the ultraviolet 8 can be transmitted, e.g., quartz.

The mold 7 includes a cavity (recess portion) 7b for facilitating deformation of the mold 7, in a surface (an incident surface on which the ultraviolet 8 is incident) opposite to the pattern surface. For example, the cavity 7b has a shape of a circular flat face. The thickness (depth) of the cavity 7b is set in accordance with the size and the material of the mold 7.

The cavity 7b is in communication with an opening 17 provided with the mold holding unit 3, and an optically transparent member 13 for making a space 12 surrounded by a part of the opening 17 and the cavity 7b an enclosed space is arranged in the opening 17. The pressure of the space 12 is controlled by a pressure adjustment unit (not shown). For example, when pressing the mold 7 against the resin 14 on the substrate 11, the pressure of the space 12 is set higher than external pressure by the pressure adjustment unit to bend a pattern 7a of the mold 7 into a projecting shape with respect to the substrate 11. The mold 7 thereby comes into contact with the resin 14 on the substrate 11 from a center portion of the pattern 7a, and therefore a gas (air) being confined between the pattern 7a and the resin 14 is suppressed, and the pattern 7a can be efficiently filled with the resin 14.

The mold holding unit 3 includes a mold chuck 15 that attracts and holds the mold 7 by means of vacuum absorption force and electrostatic force, and a mold driving unit 16 that holds the mold chuck 15 to move the mold 7 (mold chuck 15). The mold chuck 15 and the mold driving unit 16 include the opening 17 at their center portion (inside) such that the ultraviolet 8 from the irradiation unit 2 is irradiated to the resin 14 on the substrate 11.

The shape correction unit 18 is arranged in the mold chuck 15, and applies force (displacement) to a side face of the mold 7 held by the mold chuck 15 to correct the shape of the pattern 7a of the mold 7 (i.e., deforms the pattern 7a). The shape correction unit 18 includes a piezoelement that expands and shrinks due to a volume change when a voltage is applied thereto, for example, and is configured to apply pressure to a plurality of portions of each side face of the mold 7. The shape correction unit 18 matches the shape of the pattern 7a of the mold 7 with the shape of a pattern (a shot region of the substrate 11) formed on the substrate 11, by deforming the pattern 7a of the mold 7.

However, a case is also conceivable where it is difficult to match the shape of the pattern 7a of the mold 7 with the shape of the pattern formed on the substrate 11 using the shape correction unit 18. In this case, the pattern formed on the substrate 11 may also be deformed to bring the shape of the pattern 7a of the mold 7 and the shape of the pattern formed on the substrate 11 close to each other (i.e., reduce a shape difference). In order to deform the pattern formed on the substrate 11, for example, the substrate 11 may be heated so as to undergo heat deformation.

The mold driving unit 16 moves the mold 7 in the Z-axis direction so as to selectively perform pressing (imprinting) of the mold 7 against the resin 14 on the substrate 11 or separation (releasing) of the mold 7 from the resin 14 on the substrate 11. Examples of an actuator that is applicable to the mold driving unit 16 include a linear motor and an air cylinder. The mold driving unit 16 may be constituted by a plurality of driving systems such as a course driving system and a fine driving system, in order to accurately position the mold 7. The mold driving unit 16 may be configured to be able to move the mold 7 not only in the Z-axis direction but also in the X-axis direction and the Y-axis direction. Furthermore, the mold driving unit 16 may be configured to have a tilt function for adjusting a position of the mold 7 in a θ (rotation around the Z-axis) direction and an inclination of the mold 7.

Although the imprinting and the releasing of the mold 7 in the imprint apparatus 1 may be achieved by moving the mold 7 in the Z-axis direction as in the present embodiment, the imprinting and the releasing of the mold 7 may also be achieved by moving the substrate 11 (substrate stage 4) in the Z-axis direction. Also, the imprinting and the releasing of the mold 7 may be achieved by relatively moving both the mold 7 and the substrate 11 in the Z-axis direction.

The substrate 11 includes a single-crystal silicon substrate or an SOI (Silicon on Insulator) substrate, for example. The resin 14, which is to be molded by a pattern 7a of the mold 7, is supplied (coated) to the substrate 11.

The substrate stage 4 can move while holding the substrate 11. When pressing the mold 7 onto the resin 14 on the substrate 11, alignment between the mold 7 and the substrate 11 is performed by moving the substrate stage 4. The substrate stage 4 includes a substrate chuck 19 that attracts and holds the substrate 11 by means of vacuum absorption force or electrostatic force, and a substrate driving unit 20 that mechanically holds the substrate chuck 19 and allows the substrate chuck 19 to move in an XY plane. A reference mark 21, which is used in positioning of the substrate stage 4, is provided with the substrate stage 4.

Examples of an actuator that is applicable to the substrate driving unit 20 include a linear motor and an air cylinder. The substrate driving unit 20 may be constituted by a plurality of driving systems such as a course driving system and a fine driving system, in order to accurately position the substrate 11. The substrate driving unit 20 may be configured to be able to move the substrate 11 not only in the X-axis direction and the Y-axis direction but also in the Z-axis direction. Furthermore, the substrate driving unit 20 may be configured to have a tilt function for adjusting a position of the substrate 11 in a θ (rotation around the Z-axis) direction and a tilt of the substrate 11.

The resin supply unit 5 supplies (coats) the uncured resin 14 onto the substrate 11. In the present embodiment, the resin 14 is ultraviolet-curing resin having a property of being cured by the ultraviolet 8 being irradiated thereto. The resin 14 is selected in accordance with various conditions of a semiconductor device manufacturing process or the like. The amount of the resin 14 supplied from the resin supply unit 5 is set in accordance with the thickness of the pattern of the resin 14 formed on the substrate 11 (i.e., the residual layer thickness), the density of the pattern of the resin 14, or the like, for example.

The control unit 6 is constituted by a computer including a CPU, memory, and the like, and controls the overall imprint apparatus 1 in accordance with a program stored in the memory. The control unit 6 controls the imprint process for forming a pattern on the substrate by controlling operations and adjustment of each part of the imprint apparatus 1, and the like. The control unit 6 may be configured integrally with other parts of the imprint apparatus 1 (i.e., within a common housing), or may be configured separately from other parts of the imprint apparatus 1 (i.e., in another housing).

The alignment detection unit 22 detects displacement in each of the X direction and the Y direction between an alignment mark formed on the mold 7 and an alignment mark formed on the substrate 11. In other words, the alignment detection unit 22 detects displacement between the mold 7 and the substrate 11 in a direction parallel with the surface of the substrate 11, and outputs a signal of this displacement.

The amplifier 27 amplifies the output from the alignment detection unit 22, i.e., the signal of the displacement between the mold 7 and the substrate 11, based on a gain that is set by the control unit 6. The control unit 6 adjusts the position of the substrate stage 4 (i.e., moves the substrate stage 4) so as to match the relative positions of the mold 7 and the substrate 11 with each other based on the signal of the displacement between the mold 7 and the substrate 11 amplified by the amplifier 27.

The detection unit 50 detects shearing force that is applied to at least one of the mold 7 and the substrate 11 due to the viscoelasticity of the resin 14 when relatively moving the mold 7 and the substrate 11 in a state where the mold 7 is in contact with the resin 14 on the substrate 11. The shearing force refers to force in a direction (shearing direction) parallel with the contact surface of the mold 7 and the resin 14, i.e., the surface of the substrate 11.

The imprint process in the imprint apparatus 1 will now be described. Initially, the substrate stage 4 (the substrate chuck 19) is caused to hold (fix) the substrate 11 conveyed by the substrate conveyance mechanism, and the substrate stage 4 is moved such that the substrate 11 is located under the resin supply unit 5 (a resin supply position). Then, the resin 14 is supplied (coated) to a predetermined shot region (an imprint region) of the substrate 11 by the resin supply unit 5 (a coating step).

Next, the substrate stage 4 is moved such that the substrate 11 (a predetermined shot region) to which the resin 14 has been applied is located under the mold 7. Then, the mold 7 is moved in a direction of approaching the substrate 11 by the mold driving unit 16, and the mold 7 is pressed against the resin 14 on the substrate 11 (an imprinting step). The mold 7 thereby comes into contact with the resin 14 on the substrate 11, and the pattern 7a on the mold 7 is filled with the resin 14.

Next, in a state where the mold 7 is in contact with the resin 14 on the substrate 11, the ultraviolet 8 from the irradiation unit 2 is irradiated to the resin 14 via the mold 7, and the resin 14 on the substrate 11 is cured (a curing step).

Next, the mold 7 is moved in a direction of separating from the substrate 11 by the mold driving unit 16, and the mold 7 is separated from the cured resin 14 on the substrate 11 (a releasing step). A pattern (layer) of the resin 14 having a three-dimensional shape corresponding to the pattern 7a of the mold 7 is thereby formed in the shot region of the substrate 11.

These steps (imprint process) is repeated while changing the shot region by moving the substrate stage 4, and the pattern of the resin 14 can thereby be formed over the entire surface of the substrate 11, i.e., in all shot regions of the substrate 11.

Figure 2:
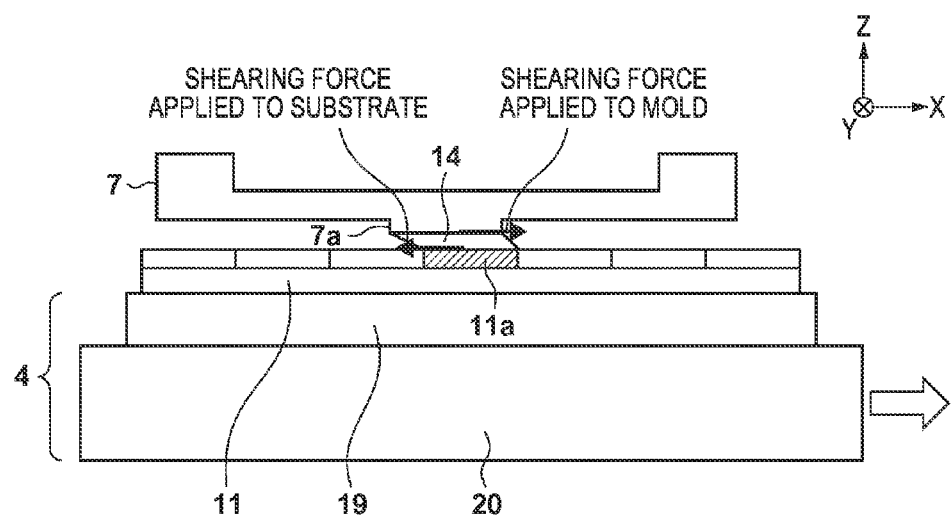
FIG. 2 is a diagram for illustrating shearing force generated on a mold and a substrate in the imprint apparatus shown in FIG. 1.

Now consider the case of performing the alignment between the mold 7 and the substrate 11 after the imprinting step, i.e., in a state where the mold 7 is in contact with the resin 14 on the substrate 11 during the imprint process. In this case, as shown in FIG. 2, shearing force may possibly be applied to at least one of the mold 7 and the substrate 11. For example, after the imprinting step, if the thickness of the resin 14 sandwiched between the mold 7 and the substrate 11 becomes thinner than a certain value, the resin 14 obtains a high viscoelasticity due to structurization of molecules in the components thereof. In general, the structurization of the resin 14 occurs at a thickness of several dozen nm or less, although this thickness is different depending on the molecular size and the molecular structure of the components. For example, even if the resin supply unit 5 controls the amount of the resin 14 supplied to the substrate 11, the thickness of the resin 14 after the imprinting step becomes smaller than or equal to the thickness at which the structurization is caused, due to a slight surface roughness of the mold 7 and the substrate 11, in some cases.

Referring to FIG. 2, consider the case where the substrate stage 4 moves in the +X direction. In this case, due to elastic deformation of the structured resin 14, the pattern 11a formed on the substrate 11 receives shearing force in the −X direction on the contact surface between the pattern 11a and the structured resin 14. Similarly, the pattern 7a of the mold 7 receives shearing force in the +X direction on the contact surface between the pattern 7a and the structured resin 14. Accordingly, the pattern (shot region) 11a on the substrate 11 and the pattern 7a on the mold 7 undergo deformation, and therefore controllability in the alignment between the mold 7 and the substrate 11 degrades. For this reason, the accuracy of the alignment between the mold 7 and the substrate 11 lowers, and the time taken for the alignment between the mold 7 and the substrate 11 becomes long.

Thus, if it is attempted to match the relative positions of the mold 7 and the substrate 11 with each other, shearing force is applied to the mold 7 and the substrate 11 due to the viscoelasticity of the resin 14. The shearing force changes as follows depending on the amount of relative movement of the mold 7 and the substrate 11. It is assumed here that the mold 7 and the substrate 11 are relatively and continuously moved in one direction in a state where the mold 7 is in contact with the resin 14 on the substrate. Also, with the position of the substrate 11 when starting the continuous movement as an initial point, the amount of movement of the substrate 11 from the initial point with respect to the mold 7 is a relative movement amount.

At first, the shearing force substantially linearly increases with respect to the relative movement amount of the mold 7 and the substrate 11, but after the relative movement amount becomes large, the viscoelasticity of the resin 14 changes and the increasing rate of the shearing force decreases. Also, upon the direction of the relative movement of the mold 7 and the substrate 11 being inverted and becoming opposite, the viscoelasticity of the resin 14 again increases, and the shearing force substantially linearly increases with respect to the relative movement amount of the mold 7 and the substrate 11.

Figure 3:
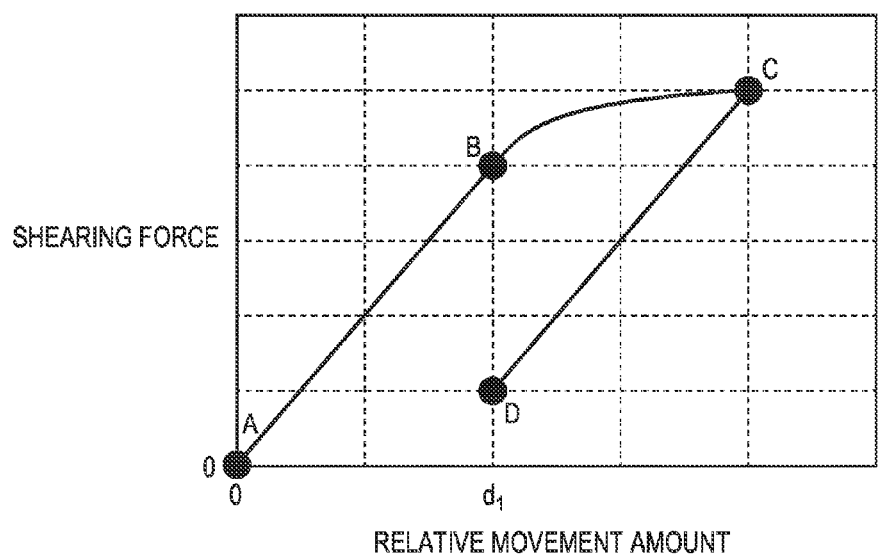
FIG. 3 is a diagram showing an exemplary relationship between shearing force and the amount of relative movement.

FIG. 3 is a diagram showing an exemplary relationship between the shearing force applied to the mold 7 and the substrate 11 and the relative movement amount of the mold 7 and the substrate 11. FIG. 3 shows a change of the shearing force when driving the substrate stage 4 and relatively moving the substrate 11 with respect to the mold 7. Assume that the substrate stage 4 starts to move in a first direction at point A, passes through point B, is thereafter inverted at point C and moves in a second direction that is opposite to the first direction, and ends the movement at point D. The shearing force linearly increases with respect to the relative movement amount of the mold 7 and the substrate 11 from point A to point B. The shearing force nonlinearly increases with respect to the relative movement amount of the mold 7 and the substrate 11 from point B to point C. The shearing force linearly increases with respect to the relative movement amount of the mold 7 and the substrate 11 from point C to point D. However, the moving direction from point C to point D is opposite to the moving direction from point A to point B, and therefore shearing force is generated in a direction opposite to the direction of the shearing force generated with respect to the movement of the mold 7 and the substrate 11 from point A to point B. In FIG. 3, the inclination of a line indicating a change of the shearing force represents the viscoelasticity of the resin 14, and the larger the inclination is, the larger the viscoelasticity of the resin 14 is. The viscoelasticity of the resin 14 when the substrate stage 4 moves from point A to point B is the same as the viscoelasticity of the resin 14 when the substrate stage 4 moves from point C to point D (i.e., the line from point A to point B is parallel with the line from point C to point D). The reason why the elastic property is dominant among the properties of the viscoelasticity of the resin 14 is because the relative movement speed of the mold 7 and the substrate 11 is very low when performing the alignment between the mold 7 and the substrate 11, and viscous drag caused by the viscoelasticity of the resin 14 is hardly generated.

Thus, if the mold 7 and the substrate 11 are relatively and continuously moved in one direction in a state where the mold 7 is in contact with the resin 14, the shearing force caused by the viscoelasticity of the resin 14 that acts between the mold 7 and the resin 14 changes with respect to the relative movement amount of the mold 7 and the substrate 11. Specifically, the shearing force linearly increases at a first increasing rate in a first region (a zone from point A to point B and a zone from point C to point D) in which the amount of movement of the substrate 11 from the initial point, which is the position of the substrate 11 when starting to move, with respect to the mold 7 does not exceed a threshold $d_1$. On the other hand, the shearing force increases at a second increasing rate that is lower than the first increasing rate, in a second region (a zone from point B to point C) in which the amount of movement of the substrate 11 from the initial point with respect to the mold 7 exceeds the threshold $d_1$. This change of the shearing force caused by the viscoelasticity of the resin 14 means a change of load conditions in the alignment between the mold 7 and the substrate 11, and will lower the alignment accuracy and lengthen the time taken for the alignment.

In the present embodiment, in order to improve the controllability in the alignment between the mold 7 and the substrate 11, the control unit 6 performs the alignment between the mold 7 and the substrate 11 while controlling a gain that is set for the amplifier 27 in accordance with the change of the shearing force caused by the viscoelasticity of the resin 14.

The control unit 6 performs the alignment between the mold 7 and the substrate 11 through a first operation and a second operation for causing the substrate stage 4 to move back and forth. The first operation is an operation of continuously moving the substrate 11 in the first direction with respect to mold 7 such that the amount of movement exceeds the threshold $d_1$. The second operation is an operation of continuously moving the substrate 11 in the second direction that is opposite to the first direction with respect to mold 7 such that the amount of movement does not exceed the threshold $d_1$.

In this alignment between the mold 7 and the substrate 11, the control unit 6 decreases the gain of the amplifier 27 in at least a part of the zone (the zone from point B to point C) in which the increasing rate of the shearing force caused by the viscoelasticity of the resin 14 decreases. For example, the control unit 6 sets the gain of the amplifier 27 to a first gain in the first region (the zone from point A to point B) in which the amount of movement of the substrate 11 from the initial point with respect to the mold 7 does not exceed the threshold $d_1$. Note that the threshold $d_1$ can be obtained from test imprint process using a dummy wafer or simulation.

Next, the control unit 6 sets (changes) the gain of the amplifier 27 to a second gain that is smaller than the first gain, in at least a part of the second region (the zone from point B to point C) in which the amount of movement of the substrate 11 from the initial point with respect to the mold 7 exceeds the threshold $d_1$. Thereby, during the alignment between the mold 7 and the substrate 11, excessive overshooting of the substrate 11 with respect to the mold 7 due to inability to follow the change of the shearing force caused by the viscoelasticity of the resin 14 can be suppressed. Note that, from the viewpoint of the suppressing of overshooting, it is favorable to change the gain of the amplifier 27 from the first gain to the second gain at a timing at which the amount of movement of the substrate 11 from the initial point with respect to the mold 7 is close to the threshold $d_1$ when in the second region in which the amount of movement exceeds the threshold $d_1$. In particular, the overshooting suppressing effect can be further improved by changing the gain of the amplifier 27 from the first gain to the second gain at a timing (point B) at which the amount of movement of the substrate 11 with respect to the mold 7 exceeds the threshold $d_1$.

The control unit 6 again increases the gain of the amplifier 27 in the zone (the zone from point C to point D) in which the increasing rate of the shearing force caused by the viscoelasticity of the resin 14 again increases. For example, the control unit 6 sets the gain of the amplifier 27 to a third gain that is larger than the second gain, when inverting the moving direction of the substrate stage 4 from the first direction to the second direction. It is thereby possible to suppress a decrease of the speed of the alignment between the mold 7 and the substrate 11 with respect to an increase of the shearing force caused by the viscoelasticity of the resin 14. Note that, although the third gain is the same as the first gain and the second gain is set back to the first gain in the present embodiment, the third gain may be different from the first gain.

The gain set for the amplifier 27 by the control unit 6 may be obtained from the test imprint process using a dummy wafer, or may be determined based on information (a table, a map, etc.) indicating a relationship between the shearing force and the gain to be set for the amplifier 27. This information may be updated in accordance with a result of the imprint process performed on the shot region of the substrate 11. Note that the shearing force applied to the mold 7 and the substrate 11 can be detected by the detection unit 50, as mentioned above. The viscoelasticity of the resin 14 can also be identified from a change of the shearing force applied to the mold 7 and the substrate 11.

Thus, in the present embodiment, the influence of a change of the shearing force is reduced by controlling the gain set for the amplifier 27 in accordance with the change of the shearing force applied to the mold 7 and the substrate 11. Accordingly, an imprint apparatus 1 can be provided that suppresses a decrease of the accuracy of the alignment between the mold 7 and the substrate 11 and lengthening of the time taken for the alignment between the mold 7 and the substrate 11, and is advantageous in the alignment between the mold 7 and the substrate 11.

In the present embodiment in which the gain of the amplifier 27 is changed from the second gain to the third gain, the timing of returning the gain from the second gain to the first gain is when the substrate 11 is overshot with respect to the mold 7 to invert the movement of the substrate stage 4. At this time, the amount of movement is compared with the relative movement amount of the mold 7 and the substrate 11 with which the increasing rate of the shearing force caused by the viscoelasticity of the resin 14 starts to decrease, i.e., the threshold $d_1$. If the displacement between the mold 7 and the substrate 11 detected by the alignment detection unit 22 is small, the gain of the amplifier 27 is increased.

FIG. 4A is a diagram showing an exemplary gain set for the amplifier 27. In FIG. 4A, the vertical axis indicates the gain set for the amplifier 27, and the horizontal axis indicates time. FIG. 4B is a diagram showing exemplary displacement between the mold 7 and the substrate 11. In FIG. 4B, the vertical axis indicates displacement between the mold 7 and the substrate 11, and the horizontal axis indicates time. In FIGS. 4A and 4B, solid lines indicate the gain set for the amplifier 27 in the present embodiment, and dotted lines indicate the gain set for the amplifier 27 in a conventional technique (i.e., in the case where the gain is fixed). However, in the present embodiment shown in FIGS. 4A and 4B, the gain of the amplifier 27 is changed only in the zone (the zone from point C to point D) in which the increasing rate of the shearing force caused by the viscoelasticity of the resin 14 again increases. This is for illustrating the meaning of returning the gain of the amplifier 27 when the substrate 11 is overshot with respect to the mold 7 to invert the movement of the substrate stage 4.

In FIG. 4B, $e_1$ represents an allowable value of the displacement between the mold 7 and the substrate 11, and $e_3$ represents the displacement between the mold 7 and the substrate 11 when starting the alignment between the mold 7 and the substrate 11. It is assumed here that $d_1 < e_3$, and a second gain $g_2$ is set in a period from time $t_1$ to time $t_2$. In a period from time $t_1$ to time $t_2$, since $d_1 < e_3$, if the substrate 11 relatively moves with respect to the mold 7 such that the amount of movement exceeds the threshold $d_1$, the increasing rate of the shearing force caused by the viscoelasticity of the resin 14 decreases. A delay occurs in the control unit 6 with respect to this change of the shearing force, and therefore, in general, the substrate 11 is overshot with respect to the mold 7. $e_2$ represents the displacement between the mold 7 and the substrate 11 due to the overshooting, and it is assumed that $d_1 > e_2$. Since $d_1 > e_2$, the displacement between the mold 7 and the substrate 11 needs to be corrected in the region in which the increasing rate of the shearing force caused by the viscoelasticity of the resin 14 does not decrease. At this time, if the second gain $g_2$ remains set for the amplifier 27, the driving force of the substrate stage 4 is small, and accordingly it takes time to set the displacement between the mold 7 and the substrate 11 to be the allowable value $e_1$ or smaller. For this reason, the gain of the amplifier 27 is set to the first gain (third gain) $g_1$ that is larger than the second gain $g_2$, and the setting time for setting the displacement between the mold 7 and the substrate 11 to be the allowable value $e_1$ or smaller can thereby be shortened.

A method for manufacturing a device (a semiconductor device, a magnetic storage medium, a liquid crystal display element, etc.) as an article will now be described. This manufacturing method includes a process of forming a pattern on a substrate (a wafer, a glass plate, a film-like substrate, etc.) using the imprint apparatus 1. The manufacturing method further includes a process of processing the substrate on which the pattern has been formed. This processing step includes a step of removing a residual layer of the pattern. The processing step may also include other known steps such as a step of etching the substrate with the pattern as a mask. The article manufacturing method in the present embodiment is advantageous in at least one of performance, quality, productivity, and production costs of the article, as compared with a conventional technique.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-143653 filed Jul. 11, 2014, which is hereby incorporated by reference herein in its entirety.

What is claimed is:

1. An imprint apparatus that forms a pattern of an imprint material on a substrate using a mold, the imprint apparatus comprising:
a detection unit configured to output a signal of displacement between the mold and the substrate by detecting positions of the mold and the substrate in a direction parallel with a surface of the substrate;
an amplifier configured to amplify the signal; and
a control unit configured to perform alignment between the mold and the substrate, by relatively moving the mold and the substrate in the direction, based on the signal that has been amplified by the amplifier,
wherein force in the direction applied to at least one of the mold or the substrate, by relatively and continuously moving the mold and the substrate in the direction in a state where the mold is in contact with the imprint material, due to a viscoelasticity of the imprint material, increases at a first increasing rate in a first region where the amount of movement of the substrate from an initial point, which is a position of the substrate when starting the movement, with respect to the mold, does not exceed a threshold, and increases at a second increasing rate that is smaller than the first increasing rate in a second region where the amount of movement exceeds the threshold,
wherein the control unit performs the alignment through a first operation of causing the substrate to move with respect to the mold in a first direction so that the amount of movement exceeds the threshold, and a second operation of moving causing the substrate to move with respect to the mold in a second direction that is opposite to the first direction by an amount of movement that does not exceed the threshold, and
wherein in the first operation, the control unit sets the gain of the amplifier to a first gain in the first region, and sets the gain of the amplifier to a second gain that is smaller than the first gain in at least a part of the second region.

2. The imprint apparatus according to claim 1, wherein, in the second operation, the control unit sets the gain of the amplifier to a third gain that is larger than the second gain.

3. The imprint apparatus according to claim 2, wherein the third gain is the same as the first gain.

4. The imprint apparatus according to claim 1, wherein, in the first operation, the control unit changes the gain of the amplifier from the first gain to the second gain at a timing at which the amount of movement of the substrate with respect to the mold exceeds the threshold.

5. The imprint apparatus according to claim 2, wherein the control unit determines the first gain, the second gain, and the third gain based on information indicating a relationship between the force in the direction and a gain that is to be set for the amplifier.

6. The imprint apparatus according to claim 1, further comprising a detection unit configured to detect the force in the direction.

7. The imprint apparatus according to claim 1, wherein the force in the direction linearly increases in the first region, and nonlinearly changes in the second region.

8. A method of manufacturing an article, the method comprising the steps of:
forming a pattern on a substrate using an imprint apparatus; and
processing the substrate on which the pattern has been formed,
wherein the imprint apparatus forms the pattern of an imprint material on the substrate using a mold, and includes:
a detection unit configured to output a signal of displacement between the mold and the substrate by detecting positions of the mold and the substrate in a direction parallel with a surface of the substrate;
an amplifier configured to amplify the signal; and
a control unit configured to perform alignment between the mold and the substrate, by relatively moving the mold and the substrate in the direction, based on the signal that has been amplified by the amplifier,
wherein force in the direction applied to at least one of the mold or the substrate, by relatively and continuously moving the mold and the substrate in the direction in a state where the mold is in contact with the imprint material, due to a viscoelasticity of the imprint material, increases at a first increasing rate in a first region where the amount of movement of the substrate from an initial point, which is a position of the substrate when starting the movement, with respect to the mold, does not exceed a threshold, and increases at a second increasing rate that is smaller than the first increasing rate in a second region where the amount of movement exceeds the threshold,
wherein the control unit performs the alignment through a first operation of causing the substrate to move with respect to the mold in a first direction so that the amount of movement exceeds the threshold, and a second operation of causing the substrate to move with respect to the mold in a second direction that is opposite to the first direction by an amount of movement that does not exceed the threshold, and
wherein in the first operation, the control unit sets the gain of the amplifier to a first gain in the first region, and sets the gain of the amplifier to a second gain that is smaller than the first gain in at least a part of the second region.

* * * * *